(12) United States Patent
Edwards et al.

(10) Patent No.: US 6,867,100 B2
(45) Date of Patent: Mar. 15, 2005

(54) SYSTEM FOR HIGH-PRECISION DOUBLE-DIFFUSED MOS TRANSISTORS

(75) Inventors: Henry L. Edwards, Garland, TX (US); Sameer Pendharkar, Richardson, TX (US); Joe Trogolo, Plano, TX (US); Tathagata Chatterjee, Allen, TX (US); Taylor Efland, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/326,214

(22) Filed: Dec. 19, 2002

(65) Prior Publication Data

US 2003/0151089 A1 Aug. 14, 2003

Related U.S. Application Data

(60) Provisional application No. 60/344,512, filed on Dec. 28, 2001.

(51) Int. Cl.[7] .............................................. H01L 21/336
(52) U.S. Cl. ........................ 438/266; 438/279; 438/301
(58) Field of Search ................................ 438/134–140, 438/266–279, 300–307

(56) References Cited

U.S. PATENT DOCUMENTS 4,078,947 A * 3/1978 Johnson et al. .............. 438/276
5,523,599 A * 6/1996 Fujishima et al. .......... 257/327

* cited by examiner

*Primary Examiner*—H. Jey Tsai
(74) *Attorney, Agent, or Firm*—Peter K. McLarty; W. James Brady, III; Frederick J. Telecky, Jr.

(57) ABSTRACT

The present invention provides a system for efficiently producing versatile, high-precision MOS device structures in which straight regions dominate the device's behavior, providing minimum geometry devices that precisely match large devices, in an easy, efficient and cost-effective manner. The present invention provides methods and apparatus for producing double diffused semiconductor devices that minimize performance impacts of end cap regions. The present invention provides a MOS structure having a moat region (404, 516, 616), and an oxide region (414, 512, 608) overlapping the moat region. A double-diffusion region (402, 504, 618) is formed within the oxide region, having end cap regions (406, 502, 620) that are effectively deactivated utilizing geometric and implant manipulations.

10 Claims, 3 Drawing Sheets

SYSTEM FOR HIGH-PRECISION DOUBLE-DIFFUSED MOS TRANSISTORS

PRIORITY CLAIM

This patent application claims priority of U.S. Provisional Application No. 60/344,512, filed on Dec. 28, 2001.

TECHNICAL FIELD OF THE INVENTION

The present invention relates, in general, to the fabrication and operation of semiconductor devices and, more specifically, to a system for producing high precision double-diffused transistor geometries in MOS technologies, particularly for use in matching pairs of semiconductor devices.

BACKGROUND OF THE INVENTION

The continual demand for enhanced integrated circuit performance has resulted in, among other things, a dramatic reduction of semiconductor device geometries, and continual efforts to optimize the performance of every substructure within semiconductor devices. As applications increasingly require higher performance related characteristics, semiconductor devices are continually redesigned to increase in precision and efficiency.

Device performance characteristics, and their relationship to semiconductor material properties and behaviors, are the subject of nearly constant scrutiny in a number of semiconductor production applications. One such application is the production and use of power transistors and high voltage devices. A number of such device rely on matching pairs of semiconductor structures—rendering the relationship between performance characteristics and material properties of great importance. As higher precision applications (e.g., sense transistors, precise ratio current mirrors) become more prevalent, there is a need for less variance in transistor performance parameters (e.g., gain factor ($\beta$), threshold voltage ($V_T$)).

Typically, high voltage applications employ power transistors with a topologically closed loop 100 or "race track" geometry, as depicted in prior art FIG. 1. In racetrack geometries, the $V_T$ is typically lower in the end cap region 102 than in the straight regions 104. Racetrack geometries create double diffused regions (DWELL) 106 that diffuse outward from the straight or convex regions along its perimeter. As a result, end cap regions 102 turn "on" faster, creating performance anomalies within the transistor. Therefore, in applications or structures where parametric matching is critical, something must be done to deactivate or minimize the end cap region 102.

In a typical conventional device, region 106 may consist of Arsenic (As) and Boron (B) implants sufficiently diffused such that the Boron "outruns" Arsenic, forming a p-type channel, with As acting as a source extension. N-type source/drain implants 108 are self-aligned to the gate, making low-resistance electrical contacts. Because the geometries of such structures do not have uniform properties at all points along their perimeters, they may be conducive to varied two and three-dimensional diffusion effects.

In two-dimensional diffusions, dopants on straight region 104 diffuse from the As implanted region and diffuse laterally into the silicon. Its volume varies proportionally to diffused distance. On the curved section 102, however, the corresponding volume slice is a section of a spherical shell, and its volume varies as diffused distance squared. Thus, dopant concentration is diluted on convex regions 102 of the DWELL due to three-dimensional diffusion.

Three-dimensional doping effects also reduce dopant concentrations in curved regions 102. In order to illustrated the three dimensional diffusion effects on a concave mask geometry, consider dopant diffusion occurring from a concave DWELL region 200 such as depicted in FIG. 2.

As with the illustration of FIG. 1, region 200 has end cap regions 202 and straight regions 204. End cap regions 202 have a threshold voltage, $V_T$, lower than that of the straight regions 204. As a result, end regions 202 "turn on" faster than the straight regions 204. Hence, curved end regions 202 dominate the device's performance properties. Thus, device width 206 directly influences a device's performance properties, such as $V_T$.

Accordingly, a minimum-width DMOS device exhibits substantial reduction in the effective $V_T$ of the overall device. Large devices generally have fewer end caps 202 per unit perimeter and exhibit generally higher threshold voltages. Therefore, matching between a large DMOS device and a small DMOS device in, for example, a high-ratio current mirror circuit, can be adversely effected. Typically, conventional DMOS device geometries contain convex regions 202 that have a lower $V_T$, degrading device precision.

Conventional end cap regions 202 may also be subject to different physical process-related distortions—such as oxide thinning, stress distribution, poly-channeling and auto-doping—due to their different proximities to field oxide regions.

As a result, there is a need for a system for producing high-precision MOS device structures in which straight regions dominate the device's behavior, providing minimum geometry devices that precisely match large devices.

SUMMARY OF THE INVENTION

The present invention provides a versatile system for system for producing high-precision MOS device structures in which straight regions dominate the device's behavior, providing minimum geometry devices that precisely match large devices, in an easy, efficient and cost-effective manner. More specifically, the present invention provides a system for producing MOS device geometries in which straight regions dominate device behavior by use of only straight and concave geometries in the double-diffused region mask opening.

As such, the present invention provides a method of producing a double diffused semiconductor device, minimizing performance impact of end cap regions, that includes providing a moat region and providing an oxide region overlappingly disposed over the moat region. A double-diffusion region, disposed within the oxide region, and having end cap regions thereto that are effectively deactivated, is also provided.

The present invention also provides double diffused semiconductor device having a moat region, an oxide region overlappingly disposed over the moat region, and a double-diffusion region. The double diffused region is disposed within the oxide region, and has end cap regions thereto that are effectively deactivated.

The present invention further provides a double diffused MOS transistor that has a moat region, an oxide region laterally and overlappingly disposed over the moat region, and a double-diffusion region, having semi-spherical end cap regions at opposite ends, disposed within the oxide and moat regions. A source contact is formed within the double diffusion region, and a drain contact is formed within the moat region outside the double diffusion region. Opposite type implants disposed within the end cap regions to effectively deactivate those regions.

Embodiments of the present invention achieve these and other objectives utilizing a number of techniques, including: the addition of an opposite type dopant (e.g., Boron) to end cap regions before poly deposition; moving end caps off the moat; adding opposite type implant to end cap regions, before poly deposition, such that its profile is concentrated and localized; and placing PSD back-gate contact in the interior of an end cap region.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The specific embodiments discussed herein are merely illustrative of specific ways to make and use the invention and do not limit the scope of the invention.

The present invention provides a versatile system for producing high-precision MOS device structures in which straight regions dominate the device's behavior, providing minimum geometry devices that precisely match large devices, in an easy, efficient and cost-effective manner. More specifically, the present invention provides a system for producing MOS device geometries in which straight regions dominate device behavior by use of only straight and concave geometries in the double-diffused region mask opening. This system renders extremely efficient matched pair design practical in a number of high-volume technologies.

Figure 3:
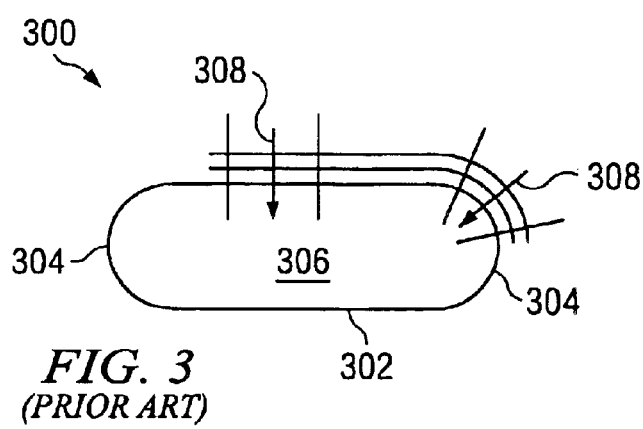
FIG. 3 illustrates dopant diffusion for a concave DWELL region, according to one aspect of the present invention.

Referring now to FIG. 3, the dopant diffusion for a concave DWELL region 300, illustrating certain aspects of the present invention, is depicted. Geometry 300 has straight regions 302 and concave regions 304. Regions 302 dominate device behavior, providing for a minimum geometry device to be matched precisely to a large device utilizing only straight 302 and concave geometries 304 in the double-diffused region mask opening 306. As dopants diffuse 308 from the DWELL mask opening 306 into the region masked during DWELL implant, their concentration is increased relative to that of a straight region 302. In accordance with the present invention, producing a DMOS transistor with only straight 302 and concave 310 regions renders a device having electrical properties dominated, substantially or completely, by the properties of straight regions 302.

Figure 4:
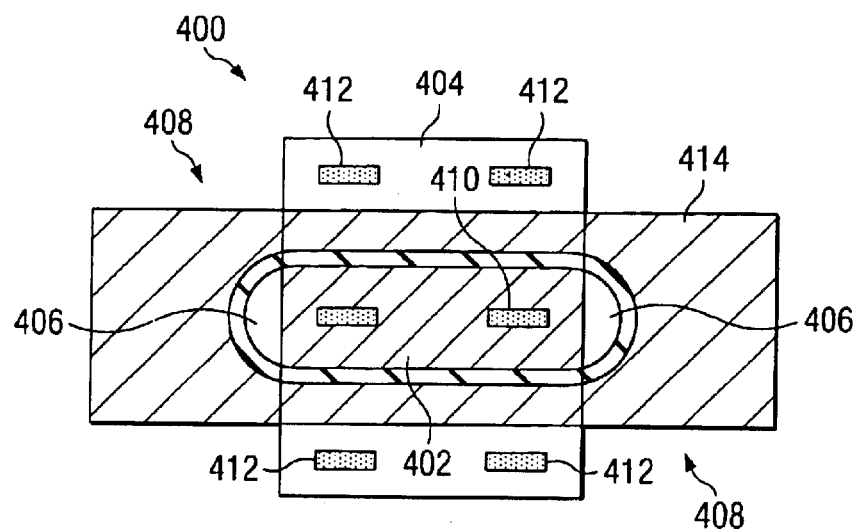
FIG. 4 illustrates a straight DWELL region in an active area according to the present invention.

The present invention is now described in greater detail, beginning in reference with FIG. 4. A device 400 comprises a DWELL region 402 within an active area 404. Region 402 is substantially straight. A channel-stop implant may be utilized to prevent leakage or punch-through in end cap regions 406 outside the moat 404 (i.e., under field oxide 408). Source 410 and drain 412 contacts are also shown. One geometry for a gate 414 is also shown.

Figure 1:
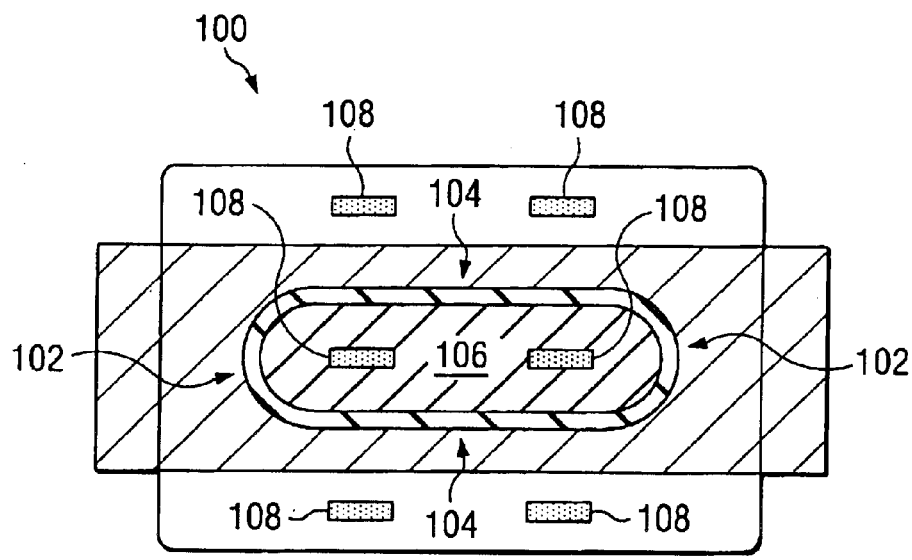
FIG. 1 illustrates a PRIOR ART double-diffused DMOS power transistor employing conventional racetrack geometry.
Figure 2:
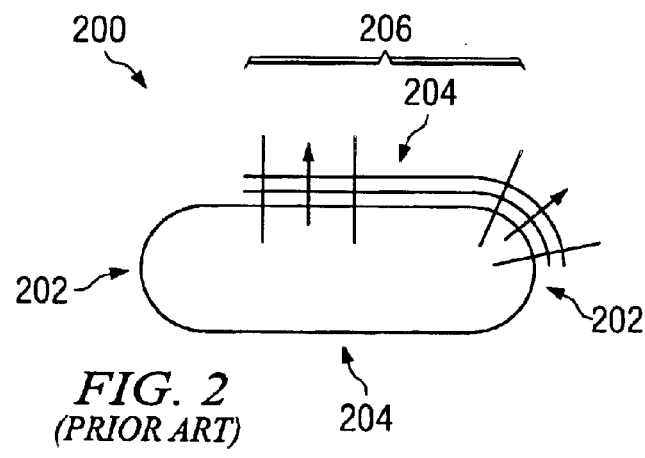
FIG. 2 illustrates reduction of dopant concentrations in curved regions caused by three-dimensional doping effects in PRIOR ART race track geometries.

For a given moat size, active width of device 400 in this particular embodiment is greater than that of the conventional geometry previously illustrated in Prior Art FIG. 1. In particular, a minimum-sized DMOS transistor, for a given electrical width, can be drawn smaller using this embodiment because the end caps 406 can be placed in the field oxide region 408 (which serves as a moat-moat isolator), rather than on the moat 404. Note that the geometry of source and drain contacts, the gate and the moat are drawn for illustrative purposes only—alternative layouts and geometries may be used in accordance with the present invention. This embodiment achieves the desired characteristics through provision of a DWELL 402 that is straight where it intersects moat 404, and providing end caps 406 in field oxide region 408—effectively inactivating them.

Figure 5:
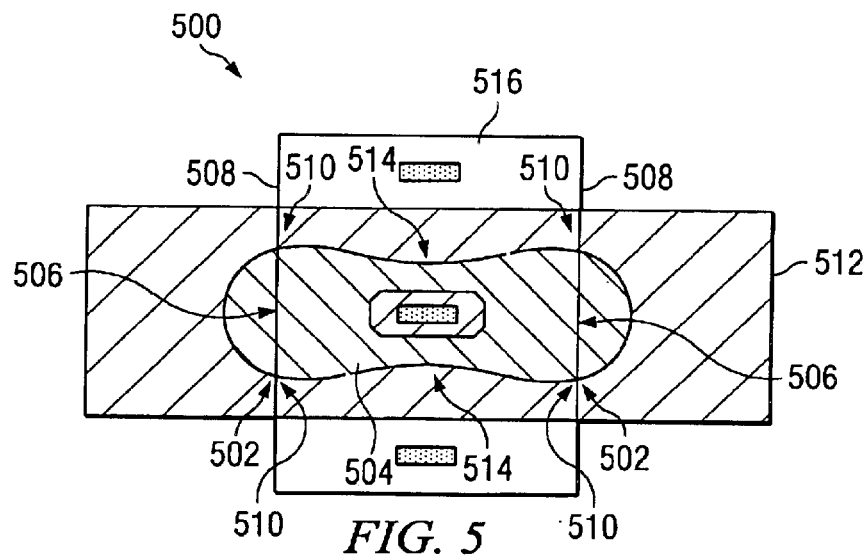
FIG. 5 illustrates an increase in doping concentration in ends of a double-diffused region mask opening, where openings are flared according to the present invention.

Reference is now made to FIG. 5, in which another device geometry 500 in accordance with the present invention is depicted. Geometry 500 implements a configuration having flared end caps 502 for DWELL 504 (as defined by a double-diffused region mask opening). The provision of the flared end caps 502 effectively increases doping concentration there. This, in effect, turns off regions 506 near moat edges 508—reducing the effects of certain process sensitivities (e.g., oxide thinning, doping variations, stress) in those areas.

With this approach, DWELL doping at corners 510, in the region under field oxide 512, is reduced. This is tolerable, however, due to the increase in $V_T$ resulting from thick oxide. In this embodiment, flared regions 502 are provided utilizing some degree of concavity in regions 514—the perimeter portions of DWELL 504 lying within moat 516. The concavity of regions 514 marginally increases the active width of the device, but this topology is still more compact other, more conventional approaches. With this embodiment, the length of end caps 502 may be optimized to the minimum required to inactivate bird's beak effects and alignment tolerances—resulting in a much smaller footprint than those of the end caps in previous embodiments.

Figure 6:
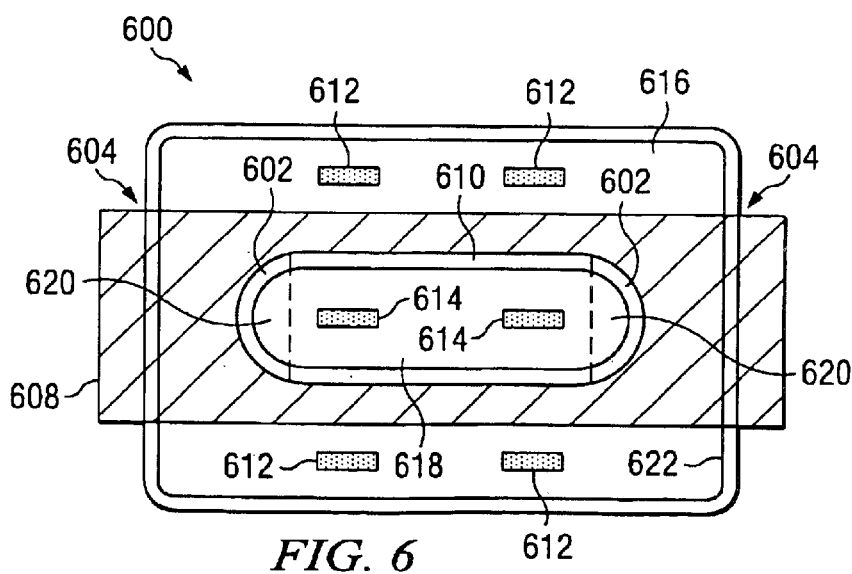
FIG. 6 illustrates a double-diffused region boundary crossing a moat-to-field oxide boundary, according to the present invention.

In another embodiment of the present invention, illustrated in FIG. 6, a DMOS device geometry 600 is depicted.

In device 600, straight regions dominate device behavior without allowing a double diffused region boundary 602 to cross a moat-to-field oxide boundary 604. The presence of DWELL boundary 602 within field oxide 608 may require p-type channel-stop 610 to prevent leakage or punch-through. In this embodiment, source contacts 612 and drain contacts 614 are switched, in comparison to previous embodiments. Backgate contact can therefore, advantageously, be made on larger moat region 616. Furthermore, because the DWELL 618 of the present embodiment has a smaller inner span and radius, it is more compact than conventional geometries. End caps 620 may also be closer to the moat edge 622, since its $V_T$ is lower. Thus, end caps 620 are less active.

Figure 7:
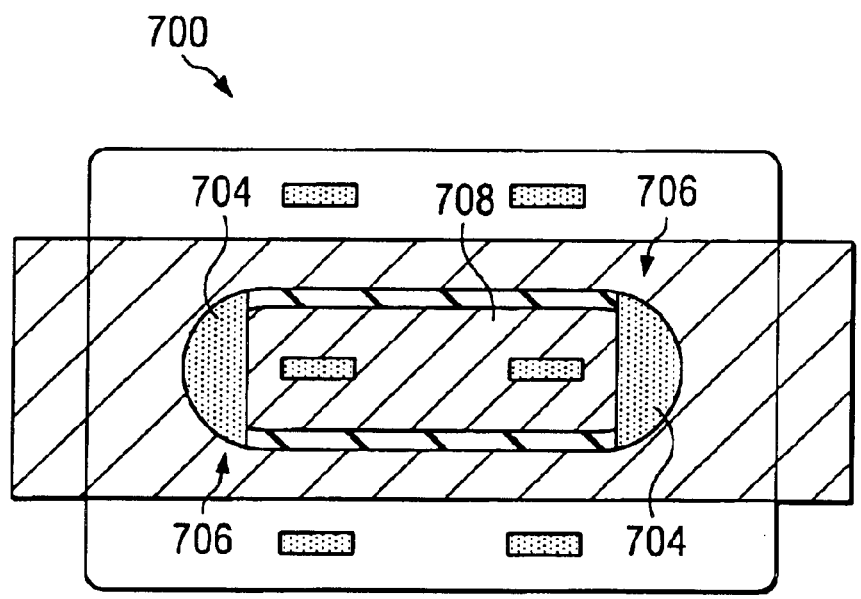
FIG. 7 illustrates deactivating DWELL end caps by adding p-type dopants to the end cap regions, according to the present invention.

Referring now to FIG. 7, another embodiment of the present invention provides for DMOS device geometry 700. In device 700, straight regions 702 dominate device behavior by virtue of p-type implant 704 added to end cap regions 706 before poly deposition. Implant 704 is preferably added after the most diffusive process steps, so that its profile is concentrated and localized. Peak DWELL doping (e.g., Boron) in end caps 706 is thus enhanced, raising $V_T$ for the end caps above that of straight sections 702—effectively deactivating the end caps. DWELL 708 (e.g., Arsenic) is not entirely compensated, due to the moderate doping concentration and depth of implant 704, but this is a secondary consideration if the $V_T$ is increased. This embodiment is applicable to any field-effect device in which a laterally diffused channel sets $V_T$. Thus, a diffused transistor, self-aligned to poly, may be realized by using geometry 700 on, for example, a poly mask shape.

Figure 8:
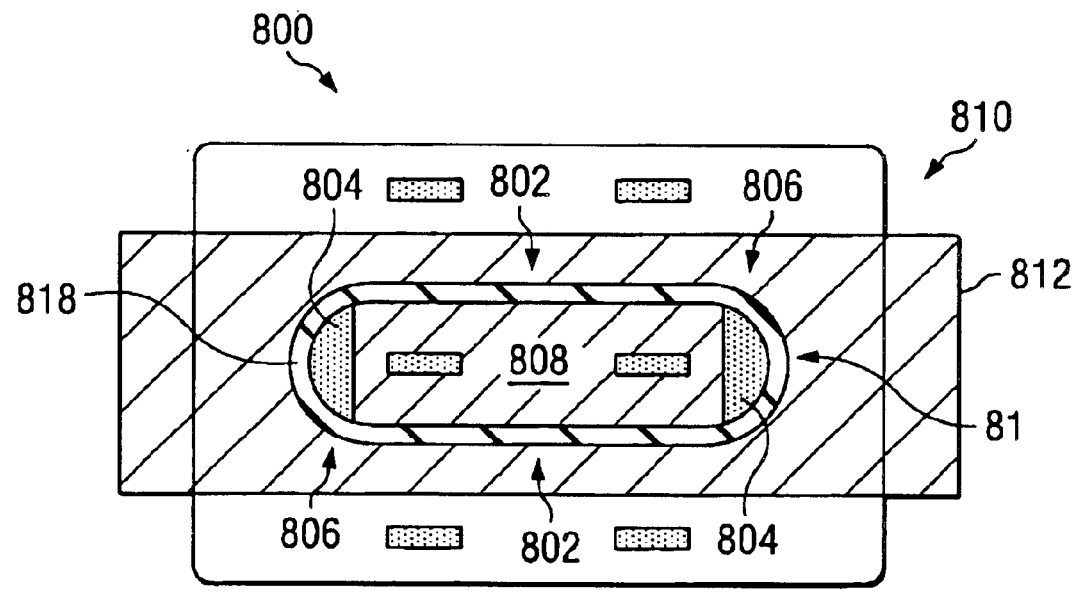
FIG. 8 illustrates counter-doping an Arsenic DWELL, and interrupting the source for end caps, according to the present invention.

In a further realization of the present invention, illustrated in FIG. 8, device geometry 800 has straight regions 802 that dominate device behavior by placement of PSD back-gate contact 804 in the interior of end cap regions 806. This arrangement counter-dopes DWELL 808, and interrupts the source for the end caps 806. However, DWELL material (e.g., Arsenic) generally diffuses laterally much farther than PSD 804. This is usually due to at least two factors. First, in most production processes, thermal budget for DWELL material is generally greater, and in some cases much greater, than for PSD material. Second, most processes will require some offset 810 (e.g., ~0.2μ) between the DWELL mask 808 and poly mask 812, to provide alignment tolerance, and further masking provided by a sidewall spacer 818 (e.g., ~0.2μ) instantiated around the perimeter of DWELL 808.

Thus, the present invention provides a number of versatile devices and geometries for optimizing average electrical properties independent of device electrical width. Hence, effective matching of large and small devices, useful in a number of applications (e.g., a high-ratio current mirror circuit), is provided. Furthermore, because large and small transistors may be laid out such that their active areas are similar, matched pairs according to the present invention are less susceptible to process variations. The present invention is useful in numerous analog technologies, and is of particular benefit to those that contain matched DMOS transistors.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A method of producing a double diffused semiconductor device to minimize performance impact of end cap regions, comprising the steps of:

providing a moat region;

forming an implanted region at least partially in said moat region by implanting a least a first and second dopant species into said moat region wherein said implanted region comprises straight regions and concave regions;

diffusing said at least first and second dopant species from said straight regions and said concave regions of said implanted region into a first unimplanted region that lies adjacent to said implanted region;

forming a first transistor source or drain region in said unimplanted region;

forming a second transistor source or drain region in said implanted region;

forming a transistor gate between said first source or drain region and said second source or drain region that overlies said straight regions and said concave regions; and wherein the concave regions of said implanted regions are formed over an oxide region formed adjacent to said moat region.

2. A method of producing a double diffused semiconductor device to minimize performance impact of end can regions, comprising the steps of:

providing a moat region;

forming an implanted region at least partially in said moat region by implanting a least a first and second dopant species into said moat region wherein said implanted region comprises straight regions and concave regions;

diffusing said at least first and second dopant species from said straight regions and said concave regions of said implanted region into a first unimplanted region that lies adjacent to said implanted region;

forming a first transistor source or drain region in said unimplanted region;

forming a second transistor source or drain region in said implanted region;

forming a transistor gate between said first source or drain region and said second source or drain region that overlies said straight regions and said concave regions; and wherein the concave regions are formed partially over said moat regions and partially over an oxide region formed adjacent to said moat region.

3. The method of claim 1, wherein the first dopant species is arsenic.

4. The method of claim 3, wherein the second dopant species is boron.

5. The method of claim 4, wherein a third dopant species is implanted into said concave regions.

6. The method of claim 5, wherein the third dopant species is a p-type dopant species.

7. The method of claim 2, wherein the first dopant species is arsenic.

8. The method of claim 7, wherein the second dopant species is boron.

9. The method of claim 8, wherein a third dopant species is implanted into said concave regions.

10. The method of claim 9, wherein the third dopant species is a p-type dopant species.

* * * * *